(12) United States Patent
Lin et al.

(10) Patent No.: US 12,371,790 B2
(45) Date of Patent: Jul. 29, 2025

(54) WAFER CARRIER WITH ADJUSTABLE ALIGNMENT DEVICES AND DEPOSITION EQUIPMENT USING THE SAME

(71) Applicant: SKY TECH INC., Hsinchu County (TW)

(72) Inventors: Jing-Cheng Lin, Hsinchu County (TW); Yu-Te Shen, Hsinchu County (TW)

(73) Assignee: SKY TECH INC., Hsinchu County (CN)

( * ) Notice: Subject to any disclaimer, the term of this patent is extended or adjusted under 35 U.S.C. 154(b) by 538 days.

(21) Appl. No.: 17/889,952

(22) Filed: Aug. 17, 2022

(65) Prior Publication Data

US 2024/0060182 A1 Feb. 22, 2024

(51) Int. Cl.
*C23C 16/40* (2006.01)
*C23C 14/50* (2006.01)
*C23C 16/458* (2006.01)

(52) U.S. Cl.
CPC .......... *C23C 16/4585* (2013.01); *C23C 14/50* (2013.01)

(58) Field of Classification Search
CPC ......... H01L 21/68735; H01L 21/68742; H01L 21/6831; H01L 21/68721; H01L 21/6833; H01L 21/68785; H01L 21/68; H01L 21/683; H01L 21/6875; H01L 21/68728; C23C 16/4585; C23C 16/458; C23C 16/4583; C23C 14/50; H01J 37/32715; H01J 37/32642
USPC ............... 156/345.51; 118/728; 269/1; 279/1
See application file for complete search history.

(56) References Cited

U.S. PATENT DOCUMENTS

| | | | | |
|---|---|---|---|---|
| 5,326,725 A | * | 7/1994 | Sherstinsky | C23C 16/042 118/503 |
| 5,589,224 A | * | 12/1996 | Tepman | C23C 16/4585 118/728 |
| 5,632,873 A | * | 5/1997 | Stevens | H01L 21/68721 204/192.12 |
| 5,800,686 A | * | 9/1998 | Littau | H01L 21/68785 118/725 |
| 5,803,977 A | * | 9/1998 | Tepman | C23C 14/50 118/728 |
| 5,810,931 A | * | 9/1998 | Stevens | H01L 21/68721 118/721 |
| 5,860,640 A | * | 1/1999 | Marohl | H01L 21/68721 414/935 |

(Continued)

*Primary Examiner* — Rudy Zervigon
(74) *Attorney, Agent, or Firm* — Chun-Ming Shih; hdls ipr services

(57) ABSTRACT

The present invention is a wafer carrier with adjustable aligning devices, which is suitable for a deposition machine. The wafer carrier comprises a tray and a plurality of adjustable aligning devices. The adjustable alignment devices are located around the tray, and include a base and an alignment pin. The adjustable alignment devices are configured to align a clamp ring of the deposition machine. The alignment pin is connected to the tray through the base, wherein the alignment pins and the bases are able to move relative to the tray to adjust the position of the alignment pins. Further, an alignment fixture can be placed on the wafer carrier to position the adjustable alignment devices around the tray, and adjust the alignment pins to preset positions, which is beneficial to improve the accuracy of alignment of the clamp ring.

10 Claims, 5 Drawing Sheets

(56) References Cited

U.S. PATENT DOCUMENTS

| | | | | |
|---|---|---|---|---|
| 5,868,847 | A * | 2/1999 | Chen | C23C 16/4585 118/715 |
| 5,922,133 | A * | 7/1999 | Tepman | C23C 14/50 118/503 |
| 5,951,775 | A * | 9/1999 | Tepman | C23C 16/4401 118/728 |
| 5,985,033 | A * | 11/1999 | Yudovsky | H01L 21/68735 118/728 |
| 6,051,122 | A * | 4/2000 | Flanigan | C23C 16/4585 204/298.31 |
| 6,123,804 | A * | 9/2000 | Babassi | H01L 21/68721 118/728 |
| 6,126,382 | A * | 10/2000 | Scales | H01L 21/68 414/757 |
| 6,143,086 | A * | 11/2000 | Tepman | C23C 14/50 118/728 |
| 6,146,504 | A * | 11/2000 | Patadia | H01L 21/68742 204/192.12 |
| 6,171,453 | B1 * | 1/2001 | Chung | H01L 21/68721 204/192.15 |
| 6,186,092 | B1 * | 2/2001 | Tsai | C23C 16/45521 118/500 |
| 6,299,689 | B1 * | 10/2001 | Wang | C23C 16/4404 257/E21.585 |
| 6,355,108 | B1 * | 3/2002 | Won | C23C 16/24 118/500 |
| 6,358,376 | B1 * | 3/2002 | Wang | H01J 37/3441 204/192.12 |
| 6,423,636 | B1 * | 7/2002 | Dordi | C25D 7/123 257/E21.585 |
| 6,511,543 | B1 * | 1/2003 | Stauss | H01L 21/68721 118/503 |
| 6,589,352 | B1 * | 7/2003 | Yudovsky | C30B 31/14 118/728 |
| 6,652,713 | B2 * | 11/2003 | Brown | H01L 21/67069 118/728 |
| 6,652,716 | B2 * | 11/2003 | Kao | C23C 14/50 118/721 |
| 7,416,979 | B2 * | 8/2008 | Yoon | H01L 21/76855 257/E21.171 |
| 7,520,969 | B2 * | 4/2009 | Miller | H01L 21/68735 118/728 |
| 7,763,147 | B1 * | 7/2010 | Schutz | H01J 37/32431 118/724 |
| 7,981,262 | B2 * | 7/2011 | Pavloff | H01J 37/32623 118/721 |
| 8,062,487 | B2 * | 11/2011 | Cheng | H01J 37/32706 118/721 |
| 8,187,970 | B2 * | 5/2012 | Ganguli | H01L 21/0206 438/630 |
| 8,580,092 | B2 * | 11/2013 | Hawrylchak | C23C 16/4585 118/728 |
| 8,668,815 | B2 * | 3/2014 | Young | H01J 37/32082 204/298.11 |
| 8,790,499 | B2 * | 7/2014 | Young | H01J 37/3408 204/298.11 |
| 8,795,479 | B2 * | 8/2014 | Bichler | H01L 21/68728 204/192.12 |
| 8,900,471 | B2 * | 12/2014 | Green | C23C 14/50 204/192.15 |
| 9,082,803 | B2 * | 7/2015 | Shimane | C23C 14/042 |
| 9,476,122 | B2 * | 10/2016 | Riker | H01J 37/32623 |
| 9,818,585 | B2 * | 11/2017 | Green | H01J 37/3408 |
| 10,344,374 | B2 * | 7/2019 | Hou | H01J 37/32715 |
| 10,376,916 | B2 * | 8/2019 | Ranish | B05C 13/00 |
| 11,581,167 | B2 * | 2/2023 | Gunther | C23C 14/34 |
| 11,915,918 | B2 * | 2/2024 | Ramalingam | H01J 37/3244 |
| 11,996,315 | B2 * | 5/2024 | Chowdhury | H01L 21/67017 |
| 2003/0075433 | A1 * | 4/2003 | Kao | C23C 14/50 204/192.12 |
| 2003/0146084 | A1 * | 8/2003 | Fu | C23C 14/14 204/298.11 |
| 2005/0133164 | A1 * | 6/2005 | Fischer | H01L 21/68735 156/345.48 |
| 2006/0178009 | A1 * | 8/2006 | Tanaka | H01L 21/68742 438/704 |
| 2006/0207508 | A1 * | 9/2006 | Leung | H01L 21/68778 118/728 |
| 2007/0209931 | A1 * | 9/2007 | Miller | H01J 37/32495 204/298.11 |
| 2007/0283884 | A1 * | 12/2007 | Tiller | H01J 37/32623 118/715 |
| 2008/0141942 | A1 * | 6/2008 | Brown | H01L 21/67069 118/723 R |
| 2008/0178801 | A1 * | 7/2008 | Pavloff | H01J 37/32477 118/504 |
| 2010/0040768 | A1 * | 2/2010 | Dhindsa | H01L 21/67069 427/248.1 |
| 2010/0065216 | A1 * | 3/2010 | Tiller | H01L 21/68735 118/728 |
| 2014/0190822 | A1 * | 7/2014 | Riker | H01J 37/32633 204/298.11 |
| 2014/0262763 | A1 * | 9/2014 | Rasheed | C23C 14/34 204/298.11 |
| 2016/0348233 | A1 * | 12/2016 | Ha | H01J 37/32715 |
| 2017/0011892 | A1 * | 1/2017 | Guo | H01L 21/68735 |
| 2018/0142340 | A1 * | 5/2018 | Johanson | H01J 37/34 |
| 2019/0259635 | A1 * | 8/2019 | Parathithasan | H01L 21/673 |
| 2019/0259647 | A1 * | 8/2019 | Thirunavukarasu | H01L 21/6835 |
| 2022/0157572 | A1 * | 5/2022 | Chowdhury | C23C 14/3407 |
| 2022/0157635 | A1 * | 5/2022 | Chowdhury | H01L 21/02656 |
| 2022/0199373 | A1 * | 6/2022 | Parimi | C23C 16/50 |
| 2022/0267901 | A1 * | 8/2022 | Lin | H01L 21/68721 |
| 2022/0406573 | A1 * | 12/2022 | Gunther | H01J 37/32651 |
| 2023/0366090 | A1 * | 11/2023 | Lin | C23C 16/4585 |
| 2024/0068089 | A1 * | 2/2024 | Lin | H01J 37/3447 |
| 2024/0203703 | A1 * | 6/2024 | Gulabal | H01L 21/68728 |

\* cited by examiner

WAFER CARRIER WITH ADJUSTABLE ALIGNMENT DEVICES AND DEPOSITION EQUIPMENT USING THE SAME

BACKGROUND

Technical Field

This disclosure is a wafer carrier with adjustable alignment devices, which is suitable for a deposition equipment to improve the accuracy of alignment of a clamp ring, and the stability of a deposition process.

Related Art

A deposition apparatus, such as a chemical vapor deposition (CVD) apparatus, a physical vapor deposition (PVD) apparatus or an atomic-layer deposition (ALD) apparatus, is commonly employed in manufacturing of integrated circuits, light-emitting diodes and displays, etc.

A deposition apparatus includes a chamber and a wafer carrier. The wafer carrier is positioned within the chamber and is configured to carry at least one wafer. To exemplify the PVD, it is required to dispose a target material within the chamber and to have the target material facing the wafer on the wafer carrier.

When performing the PVD, a clamp ring is configured to fix the wafer on the wafer carrier, thereafter a noble gas and/or reactive gas is transferred into the chamber. Meanwhile bias electricity is applied on the target material and the wafer carrier, and the wafer carrier also heats up the wafer carried thereon. The noble gas within the chamber is ionized by an effect of high-voltage electric field. The ionized noble gas is attracted by the bias electricity applied on the target material to bombard the target material. Atoms or molecules splashed, flying out from the target material are attracted by the bias electricity on the wafer carrier, and deposited on a surface of the heated-up wafer to form a thin film on the surface of the wafer.

SUMMARY

The invention provides a novel wafer carrier with a plurality of adjustable alignment devices. Before the deposition process, the positions of each adjustable alignment device can be positioned to avoid the position of the alignment devices of the wafer carriers in different produced batches is different, which affects the stability of the deposition process.

An object of the present invention is to provide a wafer carrier, which includes a tray and a plurality of adjustable alignment devices. The adjustable alignment devices are located around a bearing surface of the tray, and can be displaced relative to the bearing surface to facilitate the user to adjust the position of each adjustable alignment device. In practical application, a position fixture of the same or the same specification can be placed on the tray to position each adjustable alignment device through each alignment part of the position fixture, and then each adjustable alignment device is fixed on the tray. Thus, the adjustable alignment devices on different trays can all be positioned at the same position, which is beneficial to improve the accuracy of the alignment of the clamp ring by the adjustable alignment devices and improve the stability of the deposition process.

To achieve the object, this disclosure provides a wafer carrier suitable for a deposition equipment, wherein the deposition equipment includes a clamp ring for covering and fixing a wafer placed on the wafer carrier. The wafer carrier comprises: a tray comprising a bearing surface and at least one position hole, wherein the position hole is located on the bearing surface, and the wafer placed on the bearing surface covers the position hole on the bearing surface; and a plurality of adjustable alignment devices located around the bearing surface of the tray. The adjustable alignment device comprises: a base connected to the tray; an alignment pin disposed on the base for aligning the clamp ring of the deposition equipment, wherein the alignment pin is displaced relative to the bearing surface of the tray with the base; and at least one fixing unit connected to the tray via the base to fix the base and the alignment pin on the tray.

This disclosure further provides a deposition equipment, comprising: a chamber comprising a containing space; a blocker located within the containing space of the chamber, wherein one end of the blocker is connected to the chamber, and the other end of the blocker forms a ring-shaped wall; a clamp ring placed on the ring-shaped wall of the blocker, and comprising a aligning groove; and a wafer carrier located within the containing space. The wafer carrier comprises: a tray comprising a bearing surface and at least one position hole, wherein the position hole is located on the bearing surface, and a wafer placed on the bearing surface covers the position hole on the bearing surface; and a plurality of adjustable alignment devices located around the bearing surface of the tray. The adjustable alignment device comprises: a base connected to the tray; an alignment pin disposed on the base for aligning the clamp ring of the deposition equipment, wherein the alignment pin is displaced relative to the bearing surface of the tray with the base; and at least one fixing unit connected to the tray via the base to fix the base and the alignment pin located on the base on the tray.

BRIEF DESCRIPTION OF THE DRAWINGS

This disclosure will become more fully understood from the detailed description given herein below for illustration only, and thus not limitative of this disclosure, wherein.

DETAILED DESCRIPTION

Figure 1:
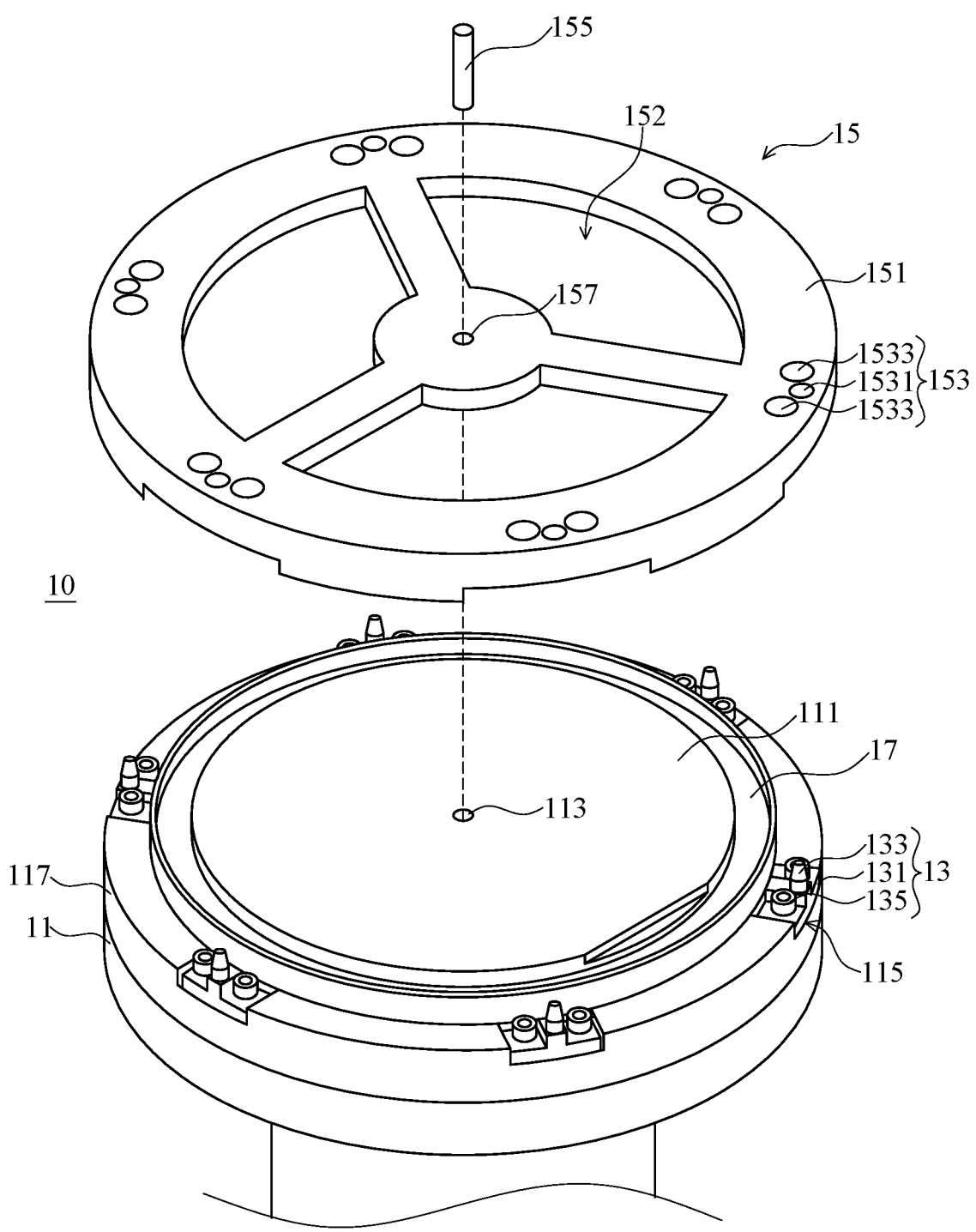
FIG. 1 is a schematic three-dimensional diagram of a wafer carrier with adjustable alignment devices according to an embodiment of this disclosure.
Figure 2:
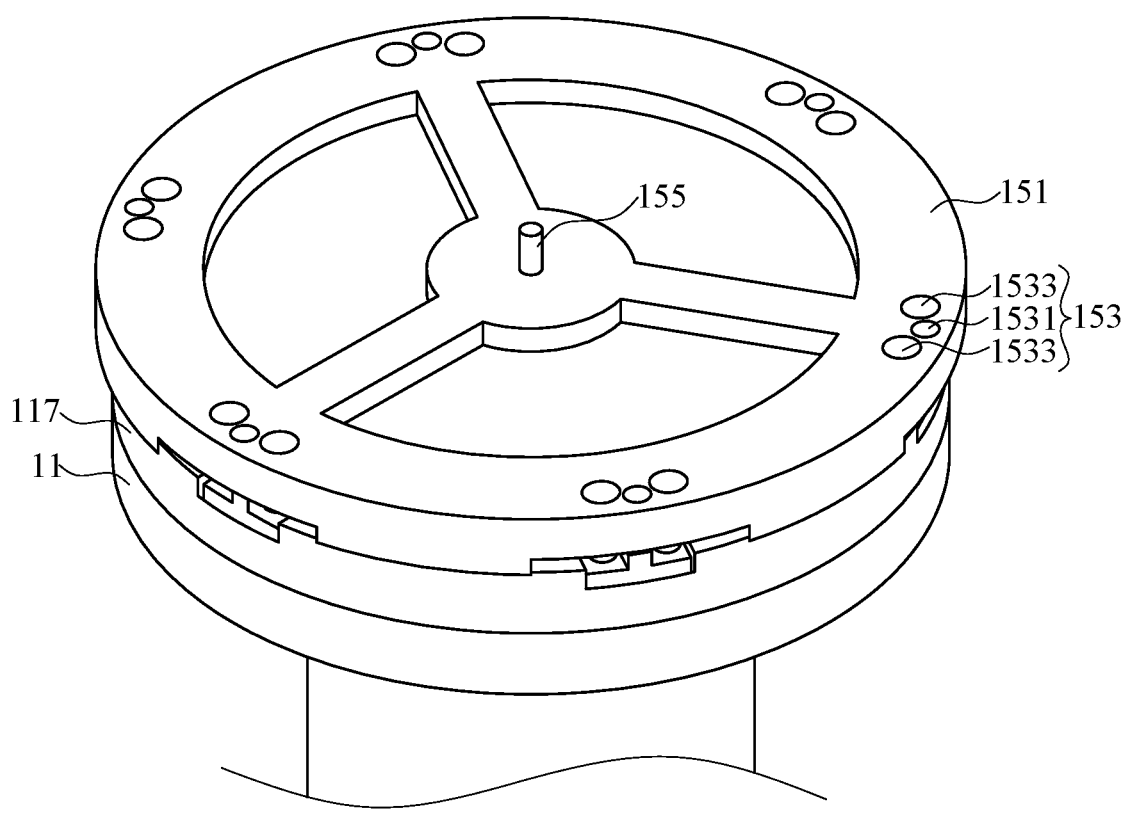
FIG. 2 is schematic three-dimensional diagram of a position fixture and the wafer carrier according to an embodiment of this disclosure.
Figure 5:
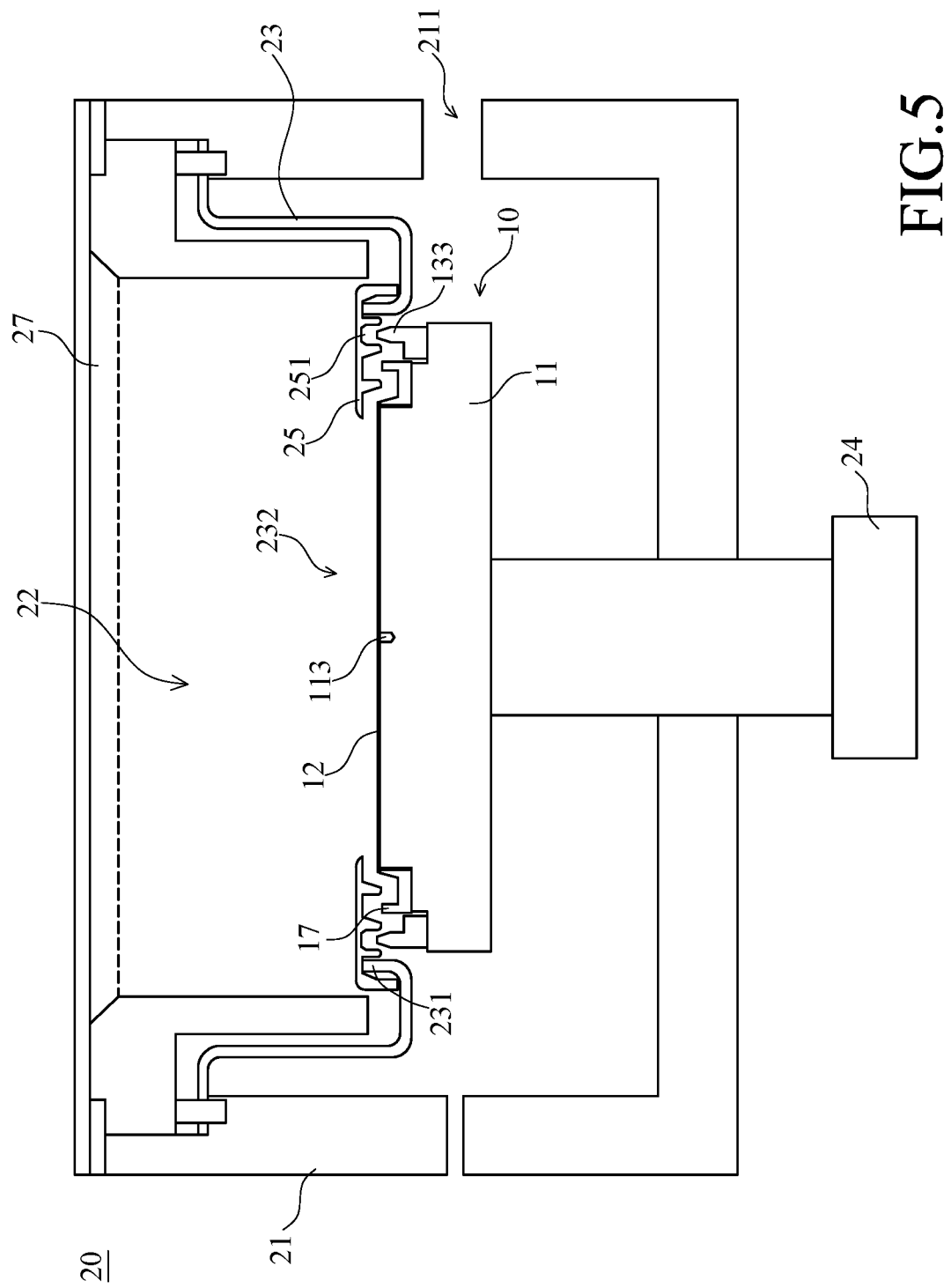
FIG. 5 is a cross section view of a deposition equipment according to an embodiment of this disclosure.

FIG. 1 and FIG. 2 are respectively a schematic three-dimensional diagram of a wafer carrier with adjustable alignment devices and a schematic three-dimensional diagram of a position fixture and the wafer carrier according to an embodiment of this disclosure. The wafer carrier 10 with adjustable alignment devices 13 of this disclosure is suitable for a deposition equipment 20, as shown in FIG. 5, and includes at least one tray 11 and a plurality of adjustable alignment devices 13. The tray 11 includes a bearing surface 111 for carrying at least one wafer 12, and the adjustable alignment devices 13 are located around the bearing surface 111 of the tray 11.

As shown in FIG. 1, at least one position hole 113 is located on the bearing surface 111 of the tray 11. When the wafer 12 is placed on the bearing surface 111, it will cover position hole 113 on the bearing surface 111. In one embodiment of the disclosure, the shape of the bearing surface 111 is similar to that of the wafer 12, such as approximately circular, and one position hole 113 may be arranged at the center the bearing surface 111. In another embodiment of the disclosure, a plurality of position holes 113 may be arranged on the bearing surface 111.

Figure 3:
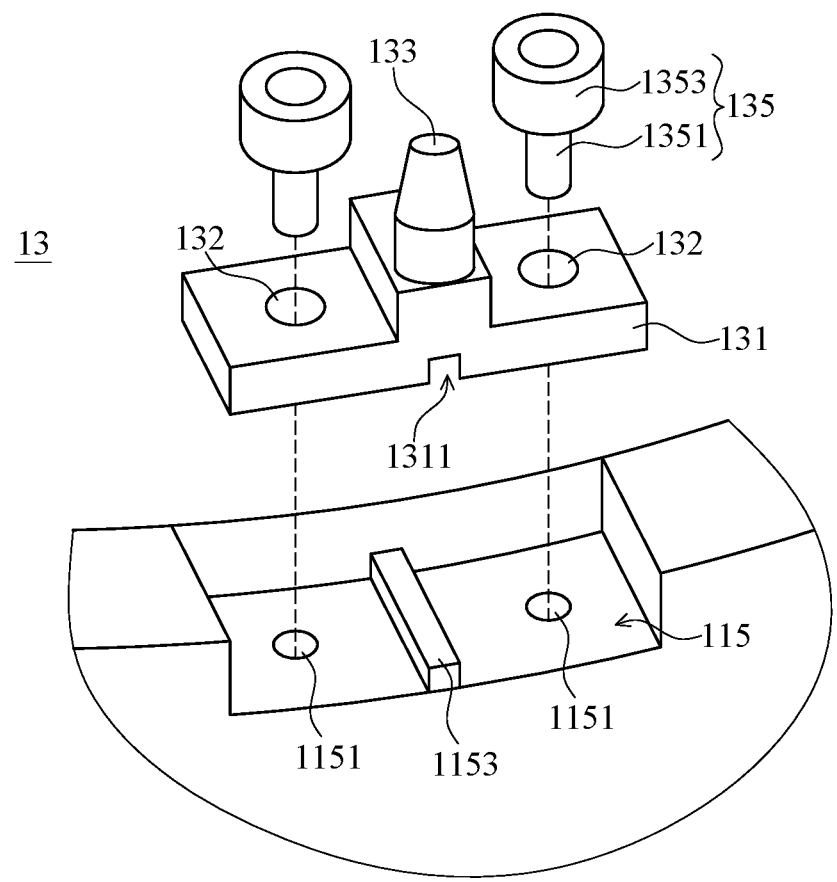
FIG. 3 is a schematic three-dimensional exploded view of an adjustable alignment device according to an embodiment this disclosure.

As shown in FIG. 1 and FIG. 3, each adjustable alignment device 13 may include a base 131, an alignment pin 133 and at least one fixing unit 135, wherein the base 131 is configured to be connected to the tray 11. Specifically, a plurality of grooves 115 are arranged around the bearing surface 111 of the tray 11, wherein each adjustable alignment device 13 is respectively arranged in each groove 115, and connected to the groove 115 of the tray 11 via the base 131.

The alignment pin 133 is disposed on the base 131, and along with the displacement of the base 131 relative to the bearing surface 111 of the tray 11. For example, the alignment pin 133 is arranged on the top surface of the base 131. When the base 131 is disposed in the groove 115 of the tray 11, the alignment pin 133 may protrude from the bearing surface 111 along the axial direction of the bearing surface 111. As shown in FIG. 5, when the wafer carrier 10 is applied to the deposition equipment 20, the alignment pins 133 are configured to align the clamp ring 25 of the deposition machine 20. The detailed structure and alignment method will be described in the following embodiments.

The fixing unit 135 is connected to the tray 11 via the base 131, and is configured to fix the base 131 on the tray 11 to fix the position of the alignment pin 133 provided on the base 131. The fixing unit 135 may include a rod 1351 and a head 1353, wherein the rod 1351 is connected to the head 1353, and the cross-sectional area of the head 1353 is larger than that of the rod 1351. For example, the fixing unit 135 may be a screw, and the rod 1351 is a threaded shank.

The tray 11 may be provided with a plurality of fixing holes 1151, and the base 131 may be provided with at least one connecting hole 132. For example, the fixing hole 1151 is disposed in the groove 115, and the connecting hole 132 is disposed on the base 131. When the base 131 is disposed in the groove 115 of the tray 11, the connecting hole 132 of the base 131 can be aligned with the fixing hole 1151 of the groove 115. Then, the rod 1351 of the fixing unit 135 is passed through the connecting hole 132 of the base 131 and connected to the fixing hole 1151 of the groove 115.

In one embodiment of the disclosure, the cross-sectional area of the connecting hole 132 of the base 131 is larger than the cross-sectional area of the rod 1351 of the fixing unit 135 and the fixing hole 1151 of the groove 115, and the cross-sectional area of the head 1353 of the fixing unit 135 is larger than the connecting hole 132 of the base 131. For example, the connecting hole 132 may be a round hole or an elongated hole. When the connecting hole 132 is the elongated hole, the length direction of the connecting hole 132 may be along the radial direction of the bearing surface 111. When the rod 1351 of the fixing unit 135 passes through the connecting hole 132 of the base 131 to connect to the fixing hole 1151 of the groove 115, the base 131 can still be displaced relative to the fixing unit 135 and the tray 11 to adjust the position of the alignment pin 133.

After completing the position of the alignment pin 133, the fixing unit 135 can be tightened, so that the head 1353 of the fixing unit 135 presses the base 131 to fasten the base 131 on the tray 11. In a preferred embodiment of the disclosure, the base 131 may include two connecting holes 132, and the groove 115 may include two fixing holes 1151. Two fixing units 135 is configured to respectively pass through the two connecting holes 132 of the base 131 and be fixed in the two fixing holes 1151 of the groove 115. The two connecting holes 132 are respectively located on both sides of the alignment pin 133, which is beneficial to stably fix the base 131 on the tray 11 through the fixing units 135.

In one embodiment of the disclosure, at least one guide 1153 may be provided between the base 131 and the groove 115 of the tray 11, and the base 131 can be displaced relative to the bearing surface 111 of the tray 11 along the guide 1153. For example, the guide 1153 is along the radial direction of the bearing surface 111. Specifically, the guide 1153 may be disposed in the groove 115, and a corresponding guide slot 1311 may be disposed on the base 131. For example, the guide 1153 may be an elongated protrusion disposed at the bottom surface or side surface of the groove 115, while the guide slot 1311 may be an elongated slot disposed at the bottom surface or side surface of the base 131. In other embodiment, the guide 1153 may be disposed on the base 131, and the guide slot 1311 may be disposed in the groove 115 of the tray 11.

In one embodiment of the disclosure, the tray 11 may include a connecting ring 117, which is disposed on the tray 11. The connecting ring 117 surrounds the bearing surface 111 of the tray 11, and the connecting ring 117 may be fixed on the tray 11 by screws. The adjustable alignment devices 13 may be arranged on the connecting ring 117 and surround the bearing surface 111 of the tray 11. For example, the grooves 115 may be arranged on the connecting ring 117, and the adjustable alignment devices 13 are arranged in the grooves 115 of the connecting ring 117.

Figure 4:
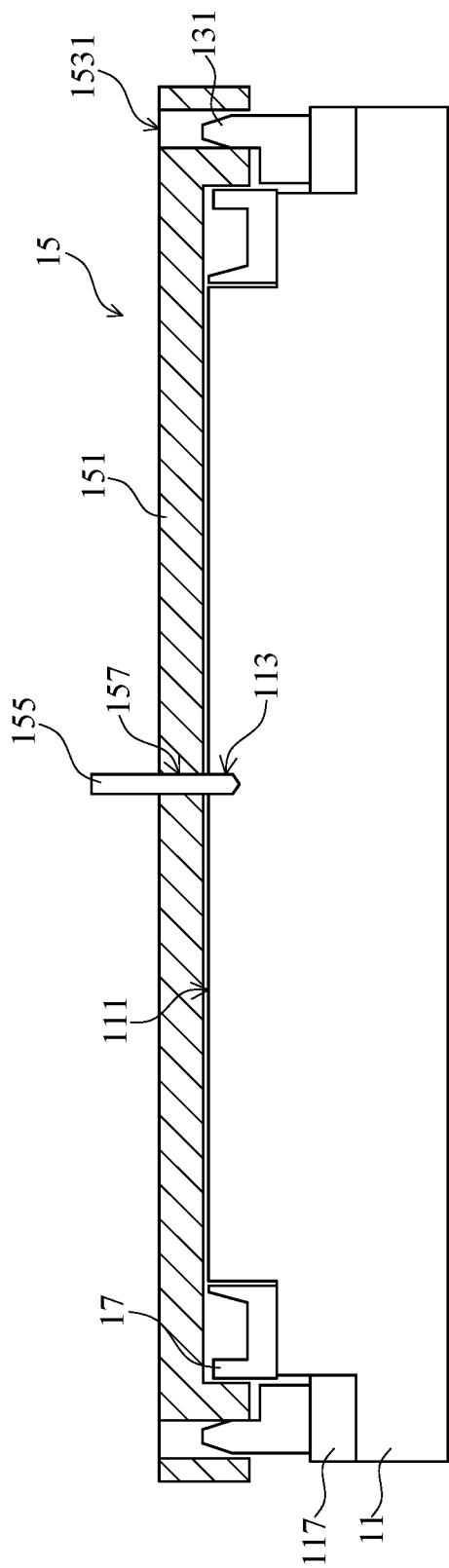
FIG. 4 is a cross section view of the position fixture and the wafer carrier according to an embodiment of this disclosure.

As shown in FIG. 1, FIG. 2 and FIG. 4, the wafer carrier 10 includes a position fixture 15 that is configured to be placed on the tray 11, and position each adjustable alignment device 13. Thus, the alignment pin 133 of each adjustable alignment device 13 is able to be positioned to a preset position.

The position fixture 15 includes a plate body 151, a plurality of position parts 153 and at least one position unit 155, wherein the position parts 153 are arranged on the plate body 151. For example, the position parts 153 are located at the peripheral area of the plate body 151. The position unit 155 is configured to insert into the position hole 113 of the tray 11 to position the position fixture 15 and the tray 11.

In one embodiment of the disclosure, the shape of the plate body 151 is similar to a circular plate, the position unit 155 is a rod-shaped latch, and a position through hole 157 is disposed on the center of the plate body 151. In addition, a plurality of hollow out patterns 152 may be provided on the plate body 151 to reduce the weight of the position fixture 15.

When positioning the adjustable alignment devices 13 on the tray 11 through the position fixture 15, the position through hole 157 of the plate body 151 is aligned with the position hole 113 on the tray 11. Then, the position unit 155 is passed through the position through hole 157 of the plate body 151 and inserted into the position hole 113 of the tray 11 to complete the positioning between the position fixture 15 and the tray 11.

In another embodiment of the disclosure, the position unit 155 may be a protruding portion disposed on the plate body 151. For example, the position unit 155 is disposed on the lower surface of the plate body 151, and faces the bearing surface 111 of the tray 11. When the position fixture 15 is placed on the tray 11, the position unit 155 of the position fixture 15 can be inserted into the position hole 113 of the tray 11 to complete the positioning between the position fixture 15 and the tray 11. In the above-mentioned embodiment, the number of the position unit 155 and/or the position through hole 157 is one. In other embodiment, the number of the position unit 155 and/or the position through hole 157 may be multiple.

The number of the groove 115 and the number of the adjustable alignment device 13 of the tray 11 will be the same as the number of the position part 153 on the position fixture 15. When the position fixture 15 is placed on the tray 11, the adjustable alignment devices 13 on the tray 11 are aligned with the position parts 153 on the position fixture 15 respectively.

The position part 153 may include an alignment pin position hole 1531 and at least one through hole 1533, wherein the alignment pin position hole 1531 and the through hole 1533 are located on the plate body 151. In one embodiment of the disclosure, the through hole 1533 and the alignment pin position hole 1531 may penetrate through the top surface and the bottom surface of the plate body 151. In other embodiment of the disclosure, the alignment pin position hole 1531 may be a groove on the bottom surface of the plate body 151. In addition, the number of the alignment pin position hole 1531 is the same as that of the alignment pin 133 of the adjustable alignment device 13, and the number of the through hole 1533 is the same as that of the fixing unit 135. For example, two through holes 1533 are located on both sides of the alignment pin position hole 1531.

In an embodiment of the disclosure, the cross-sectional area of the alignment pin position hole 1531 is similar to the cross-sectional area or the largest cross-sectional area of the alignment pin 133. When the position fixture 15 is used to position the adjustable alignment devices 13 on the tray 11, the fixing units 135 of the adjustable alignment device 13 can be loosened or removed first, and then the base 131 and the alignment pin 133 of the adjustable alignment device 13 are able to be displaced relative to the tray 11. For example, the base 131 and the alignment pin 133 are displaced relative to the bearing surface 111 of the tray 11 along the guide 1153.

Thereafter, the position fixture 15 is placed on the tray 11, and the position unit 155 is configured to position the position fixture 15 and the tray 11, as shown in FIG. 2 and FIG. 4. During alignment of the position fixture 15 and the tray 11, the alignment pin 133 is located in the alignment pin position hole 1531 of the position fixture 15, and the fixing unit 135 faces or locates in the through hole 1533 of the position part 153. Since the cross-sectional area of the alignment pin position hole 1531 and the alignment pin 133 is similar, the alignment pin position hole 1531 is able to guide the alignment pin 133 and the base 131 to the preset position.

In another embodiment of the disclosure, the cross-sectional area of the alignment pin position hole 1531 may be slightly larger than that of the alignment pin 133. During the process of positioning the alignment pins 133, the alignment pins 133 may be close to the inner edge of the alignment pin position holes 1531 to complete the positioning of the alignment pins 133.

After the positioning of the alignment pins 133 are completed, the fixing unit 135 can be tighten on the fixing hole 1151 via the through hole 1533 of the position fixture 15 to fix the base on the tray 11. For example, the head 1353 of the fixing unit 135 may press against the base 131 to fix the base 131 and the alignment pins 133 on the tray 11. In one embodiment of the disclosure, the fixing unit 135 may be a screw, and a screwdriver is able to pass through the through hole 1533 on the plate body 151 to tighten the fixing unit 135 on the fixing hole 1151 of the tray 11. Specifically, the through hole 1533 on the plate body 151 is a working space for a locking tool to fasten or loosen the fixing unit 135.

In one embodiment of the disclosure, as shown in FIG. 1 and FIG. 4, a ring member 17 may be arranged around the bearing surface 111 of the tray 11, wherein the ring member 17 may be located between the bearing surface 111 and the alignment pins 133.

FIG. 5 is a cross-sectional view of a deposition equipment according to an embodiment of this disclosure. The deposition equipment 20 includes a chamber 21, a blocker 23, a clamp ring 25 and a wafer carrier 10, wherein the chamber 21 has a containing space 22 for containing the blocker 23, the clamp ring 25 and the wafer carrier 10.

One end of the blocker 23 is connected to the chamber 21, while the other end of the blocker 23 forms a ring-shaped wall 231 in the containing space 22. A hollow opening 232 is formed on the inner side of the ring-shaped wall 231. For example, the ring-shaped wall 231 may be a hollow cylinder.

The clamp ring 25 is similar to an annular, and the diameter of the clamp ring 25 is larger than that of the hollow opening 232 of the blocker 23. The clamp ring 25 is configured to be placed on the ring-shaped wall 231 of the blocker 23. Further, at least one aligning groove 251 may be provided on the surface of the clamp ring 25 facing the tray 11.

The wafer carrier 10 may be located in the vertical projection of the hollow opening 232 formed by the blocker 23, wherein the detailed structure of the wafer carrier 10 is as shown in FIG. 1, FIG. 2, FIG. 3, FIG. 4 and the corresponding descriptions. The wafer 12 is placed on the bearing surface 111 of the tray 11 and covers the position hole 113 on the bearing surface 111.

The tray 11 may be connected to an elevating unit 24. The elevating unit 24 is configured to drive the tray 11 and the wafer 12 to move relative to the blocker 23 and the clamp ring 25. For example, the elevating unit 24 may be a linear actuator.

In practical application, the elevating unit 24 is configured to drive the tray 11 located below the blocker 23 and the clamp ring 25 to approach the blocker 23 and the clamp ring 25. For example, the tray 11 may be located at the wafer gate 211, and the elevating unit 24 is configured to drive the tray 11 and the wafer 12 to displace from the wafer gate 211 to the blocker 23 and the clamp ring 25.

Further, the elevating unit 24 may continuously drive the tray 11 to pass through the hollow opening 232 of the blocker 23, and the alignment pins 133 of the adjustable alignment device 13 will contact the aligning grooves 251 at the bottom of the clamp ring 25 to guide the clamp ring 25 to a preset position of the tray 11. Thus, the clamp ring 25 will cover the edge of the wafer 12, and fix the wafer 12 placed on the tray 11.

In one embodiment of the disclosure, the top of the alignment pin 133 may have an inclined surface, so that the cross-sectional area of the top of the alignment pin 133 is smaller than that of the bottom. During the alignment process of the clamp ring 25, the inclined surface on the top of the alignment pin 133 may first contact the alignment groove 251 of the clamp ring 25 to guide the clamp ring 25. Then, the vertical surface of the aligning groove 251 is aligned with the vertical surface below the inclined surface of the alignment pin 133 to complete the alignment between the clamp ring 25 and the tray 11. The aligned clamp ring 25 covers the edge of the wafer 12 on the tray 11 and covers the ring member 17 located between the bearing surface 111 and the alignment pin 133.

In practical application, the positions of the alignment pins 133 on the trays 11 in different production batches may be different, and thus the alignment pins 133 of different trays 11 cannot guide the same clamp ring 25 to the same position, which in turn leads to differences in deposition process conditions.

In order to solve the above-mentioned problems, the disclosure proposes a wafer carrier 10 with adjustable alignment devices 13, and a deposition equipment 20 applying the wafer carrier 10. As shown in FIG. 1, FIG. 2 and FIG. 4, before the deposition process, the user can use the same position fixture 15 to position the alignment pins 133 on each tray 11, so that the alignment pins 133 on each tray 11 will be located at the same position.

In one embodiment of the invention, the deposition equipment 20 may be a physical vapor deposition device, and a target material 27 is arranged within the chamber 21, wherein the target material 27 faces the bearing surface 111 of the tray 11 and/or the wafer 12.

The above description is only a preferred embodiment of this disclosure, and is not intended to limit the scope of this disclosure. Modifications should be included within the scope of the patent application of this disclosure.

What is claimed is:

1. A deposition equipment, comprising:
a chamber comprising a containing space;
a blocker located within the containing space of the chamber, wherein one end of the blocker is connected to the chamber, and the other end of the blocker forms a ring-shaped wall;
a clamp ring placed on the ring-shaped wall of the blocker, and comprising a aligning groove; and
a wafer carrier located within the containing space, and comprising:
   a tray comprising a bearing surface and at least one position hole, wherein the position hole is located on the bearing surface, and a wafer placed on the bearing surface covers the position hole on the bearing surface; and
   a plurality of adjustable alignment devices located around the bearing surface of the tray, and comprising:
      a base connected to the tray;
      an alignment pin disposed on the base for aligning the clamp ring of the deposition equipment, wherein the alignment pin is displaced relative to the bearing surface of the tray with the base; and
      at least one fixing unit connected to the tray via the base to fix the base and the alignment pin located on the base on the tray.

2. The deposition equipment according to claim 1, further comprising a position fixture for connecting to the tray and positioning the adjustable alignment devices on the tray, and the position fixture comprising: a plate body; a plurality of position parts arranged on the plate body, wherein the position parts comprising: an alignment pin position hole located on the plate body; at least one through hole located on the plate body, wherein when the position fixture is configured to be connected to the tray, the alignment pin of the adjustable alignment device is located in the alignment pin position hole of the position part, and the fixing unit faces the through hole of the position part; and a position unit for inserting into the position hole of the tray to position the position fixture and the tray.

3. The deposition equipment according to claim 2, wherein the position unit is a protruding part, and is arranged on the plate body of the position fixture.

4. The deposition equipment according to claim 2, wherein the plate body comprises a position through hole, and the position unit is configured to pass through the position through hole of the plate body and be inserted into the position through hole of the tray.

5. The deposition equipment according to claim 1, wherein the tray comprises a plurality of grooves, which are arranged around the bearing surface, and the adjustable alignment devices are arranged in the grooves respectively.

6. The deposition equipment according to claim 5, further comprising a guide provided between the groove and the base of the adjustable alignment device, wherein the base is displaced relative to the bearing surface of the tray along the guide.

7. The deposition equipment according to claim 6, wherein the tray comprises at least one fixing hole, the base comprises at least one connecting hole, and the fixing unit is configured to pass through the connecting hole of the base, and connect to the fixing hole of the tray to fix the base on the tray.

8. The deposition equipment according to claim 7, wherein the fixing unit includes a rod and a head, the rod of the fixing unit passes through the connecting hole of the base and is connected to the fixing hole of the tray, wherein a cross-sectional area of the connecting hole of the base is larger than the cross-sectional area of the rod of the fixing unit.

9. The deposition equipment according to claim 1, wherein the tray comprises a connecting ring, which is disposed on the tray and surrounds the bearing surface of the tray, and the adjustable alignment devices are disposed on the connecting ring.

10. The deposition equipment according to claim 1, further comprising a ring member disposed around the bearing surface of the tray, and located between the bearing surface and the alignment pin.

* * * * *